United States Patent [19]

Furumura et al.

[11] Patent Number: 4,510,177
[45] Date of Patent: Apr. 9, 1985

[54] METHOD AND APPARATUS FOR VAPOR PHASE DEPOSITION

[75] Inventors: Yuji Furumura; Takeshi Nishizawa, both of Kawasaki, Japan

[73] Assignee: Fujitsu Limited, Kawasaki, Japan

[21] Appl. No.: 405,082

[22] Filed: Aug. 4, 1982

[30] Foreign Application Priority Data

Aug. 8, 1981 [JP] Japan ................ 56-124515

[51] Int. Cl.³ .................. H01L 21/365; H01L 21/383
[52] U.S. Cl. .................... 427/85; 427/255.2;
156/613; 118/900; 148/174; 148/175
[58] Field of Search .................... 427/85, 255.1, 255.2;
148/174, 175; 118/900; 156/611, 613, 614

[56] References Cited

U.S. PATENT DOCUMENTS 3,660,179  5/1972  Desmond et al. ............... 427/85 X
4,100,310  7/1978  Ura et al. ....................... 427/85 X
4,389,273  6/1983  Bloem et al. .................... 156/613
4,430,149  2/1984  Berkman ........................ 156/613

FOREIGN PATENT DOCUMENTS 2743909  4/1979  Fed. Rep. of Germany .

OTHER PUBLICATIONS

IBM Technical Disclosure Bulletin, "Insuring Consistent Doping Levels of Epitaxial Layers Grown on Batches of Wafers", vol. 15, No. 11, Apr. 1973, pp. 3550-3551.
IBM Technical Disclosure Bulletin, "Improving Resistivity and Thickness Uniformity of Epitaxial Deposits", vol. 13, No. 12, May 1971, p. 3887.

Primary Examiner—John D. Smith
Assistant Examiner—Bernard F. Plantz
Attorney, Agent, or Firm—Staas & Halsey

[57] ABSTRACT

A plurality of wafers on which semiconductor films having a uniform thickness and specific resistivity are obtained by a horizontal type low pressure vapor phase deposition system, i.e., a system using a horizontal reaction tube, in which wafers are aligned in parallel and transverse to a longitudinal axis of the tube. A main gas is introduced from a main inlet into the reaction tube and an auxiliary gas including an impurity gas is introduced from an auxiliary inlet into the reaction tube in such a manner that the impurity gas diffuses toward the main inlet along an inner wall of the reaction tube.

11 Claims, 7 Drawing Figures

METHOD AND APPARATUS FOR VAPOR PHASE DEPOSITION

BACKGROUND OF THE INVENTION

This invention relates to a method and apparatus for vapor phase deposition, more particularly to a method and apparatus for vapor phase deposition under low pressure using a horizontal type reaction tube in which a large number of semiconductor substrates are arranged in parallel and transversely to the longitudinal axis of the tube.

Many types of vapor phase deposition systems such as horizontal, vertical and barrel types, are known in the art. Vertical and barrel type systems, however, are relatively poor in productivity since only a small number of wafers can be loaded therein. Horizontal type systems, i.e., systems having a horizontal reaction tube, are preferable since a large number of wafers can be loaded therein by arranging them in the tube in parallel and transversely to the longitudinal axis of the tube.

Horizontal type systems in which wafers are arranged in parallel and transversely to the axis of the reaction tube (referred to hereon as "horizontal type systems"), however, cannot be easily applied to epitaxial growth of impurity-doped single crystalline films since such applications require strict film thickness specific resistivity, and other conditions.

In the reaction tube of the horizontal type system, for example, silicon source and impurity gases progressively decrease in concentration from the inlet toward the outlet due to their consumption. This causes a corresponding progressive decrease in the thickness and doping concentration of the deposited film. This in turn causes a corresponding increase in the specific resistivity of the film. Provision of a temperature gradient increasing from the inlet toward the outlet along the axis of the tube can give the thickness of the deposited films uniformity in spite of the progressive decrease in the concentration of the reaction gas. However, it also causes reduction in impurity concentration from the inlet toward the outlet. The resultant films therefore have different thicknesses and/or impurity concentrations, i.e., specific resistivities. Thus, only a small number of the products can meet the strict requirements of thickness and specific resistivity.

SUMMARY OF THE INVENTION

It is an object of the present invention to provide a horizontal type vapor phase deposition system which can produce a large number of epitaxial films with excellent uniformity in both film thickness and impurity concentration.

The above object is attained by providing a method of vapor phase deposition for growing a semiconductor layer on a plurality of wafers, wherein a main gas, comprising a reaction gas and a impurity gas flows in a first direction through a deposition region in a reaction tube. The plurality of wafers are arranged in the deposition region so that each of the major surfaces of the plurality of wafers in parallel to the others and is transverse to a longitudinal axis of the reaction tube. An auxiliary gas comprising an impurity gas is introduced into the reaction tube at a position downstream of the deposition region in such a manner that the impurity gas of the auxiliary gas diffuses in a second direction opposite to the first direction along an inner wall of the reaction tube.

This invention is based on the discovery that a gas fed to a reaction tube near a discharge port can diffuse toward a gas inlet along the inner stagnant layer in spite of gas suction toward the discharge port and the gas flow from the gas inlet toward the discharge port. Such reverse diffusion occurs more easily in a lower pressure. The reverse diffusion effectively makes up for the decreased gas concentration only when the decreased gas ratio as considerably low compared with the other gas ratios. These conditions are well satisfied in the case of vapor phase epitaxial growth under low pressure. It is also preferred that the impurity gas of the auxiliary gas be diffused in a reverse direction since its concentration is very low.

Further, it is preferable to guide the auxiliary gas along the inner wall of the reaction tube since the velocity of the main gas flow from the gas inlet toward the gas outlet in the reaction tube is very slow there. Such guidance is preferably assisted by use of an inner tube, inserted inside the reaction tube, having openings distributed along the axis of the tube.

According to this invention, there is also provided an apparatus for vapor phase deposition of a semiconductor film on a plurality of wafers comprising: (a) a reaction tube having a deposition region in which said plurality of wafers are so arranged that each of the major surfaces of the plurality of wafers is parallel to the others and is transverse to a longitudinal axis of the reaction tube; (b) means for heating the wafers; (c) means for flowing a main gas in a first direction through the deposition region in the reaction tube; and (d) means arranged downstream of the deposition region, for introducing an auxiliary gas into the reaction tube in such a manner that the auxiliary gas diffuses along an inner wall of the reaction tube in a second direction opposite to the first direction.

It is preferred that the apparatus further comprise means for guiding the auxiliary gas along the inner wall of the reaction tube. The guiding means may be a tubular member extending inside the reaction tube in the second direction.

It is also preferred that the reaction tube comprise an outer tube and an inner tube surrounded by the outer tube and removable from the reaction tube so that matter deposited on the inner wall of the inner tube can be easily cleaned off. It is further preferred that the inner tube have a plurality of openings distributed along the longitudinal axis of the inner tube, and the inner tube and the outer tube form therebetween an annular space into which the auxiliary gas is fed. The openings provided on the inner tube may be of a shape elongated along the side of the inner tube and may be staggered along the axis of the inner tube. Alternatively, a plurality of inner tubes may be arranged along the axis of the reaction tube with the spaces therebetween defining annular openings.

Preferred embodiments of the present invention are described below by way of example with reference to the accompanying drawings.

DESCRIPTION OF THE PREFERRED EMBODIMENTS

Figure 1:
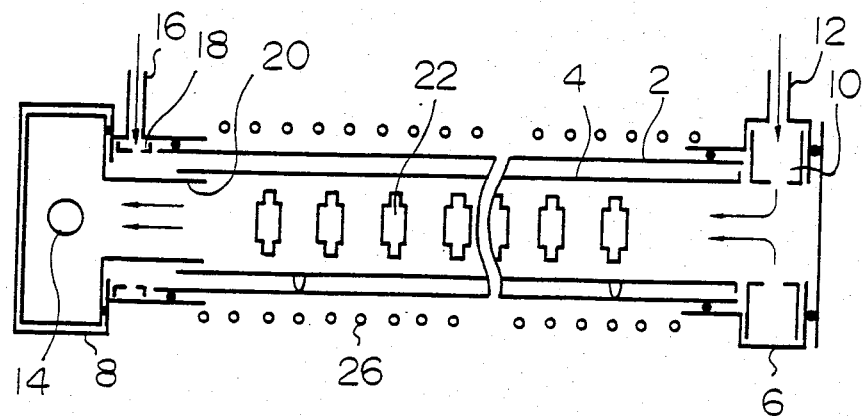
FIG. 1 is a schematic representation of a first preferred embodiment of the apparatus for the present invention.

The method according to the present invention was tested by using a vapor phase deposition apparatus as illustrated in FIG. 1. The apparatus in FIG. 1 comprises a reaction tube, comprising a 230 mm$\phi$(230 millimeters in diameter) quartz tube 2 and 200 mm$\phi$ quartz inner tube 4 concentrically inserted therein, stainless steel inlet member 6, and stainless steel outlet member 8. Inlet member 6 has annular chamber 10 having at least three 10 mm$\phi$-bores distributed in the inner wall thereof. Chamber 10 is connected to inlet pipe 12. Outlet member 8 has a discharge port 14. The apparatus further comprises, at the end of reaction tube 2 near outlet port 14, as auxiliary gas inlet 16 and an annular chamber 18 having twenty 5 mm$\phi$-bores distributed in the inner wall thereof. Inside annular chamber 18 there is provided annular guide member 20 having a diameter of 180 mm for the guiding auxiliary gas along the inner wall of inner tube 4.

Figure 2:
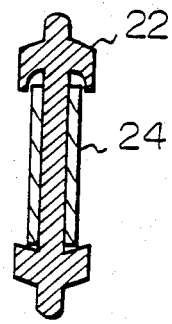
FIG. 2 is a sectional view of a susceptor used in the apparatus in FIG. 1.

Twenty-one susceptors 22, each holding two silicon wafers 24 as shown in FIG. 2, where inserted in inner tube 4. These susceptors 22 were equally spaced over a 600 mm distance. Susceptors 22 were successively numbered from the left side (No. 1) to the discharge side (No. 21). The distance from susceptor No. 21 to annular guide member 20 was 450 mm. The silicon wafers 24 were heated by susceptor 22 which is inductively heated by work coil 26.

In the operation, a gas mixture of dichlorosilane (SiH$_1$Cl$_2$), hydrogen (H$_2$) and phosphine (PH$_3$) was fed through the inlet pipe 12 and annular chamber 10 into the inner tube 4 and evacuated through discharge port 14. The gas feeding rates were 5 l/min for H$_2$, 500 cm$^3$/min for SiH$_2$Cl$_2$, and 20 cm$^3$/min for H$_2$ containing 1 ppm-PH$_3$. The pressure inside the tube was 1.0 Torr. The temperatures of the silicon wafers 24 were controlled to increase proportionally from 1025° C. at susceptor No. 1 to 1050° C. at susceptor No. 21. An auxiliary gas comprising 100 ppm-P$_3$ in H$_2$ was fed through auxiliary gas inlet 16 and annular chamber 18 at a gas feeding rate of 12 cm$^3$/min for H$_2$ containing PH$_3$. In this case the end of the annular space formed between tube 2 and inner tube 4 near inlet member 6 was closed so as not to allow auxiliary gas to flow therethrough and not to allow main gas to enter therein.

Figure 3:
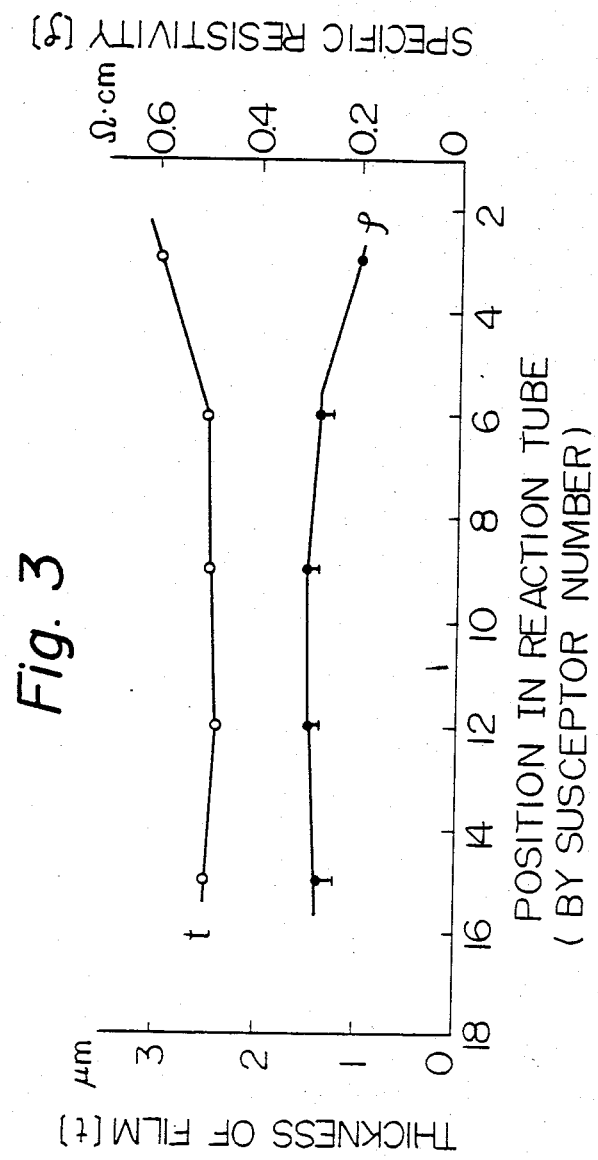
FIG. 3 is a graph of the thickness and specific resistivity of deposited film obtained by the apparatus in FIG. 1 vs the position in the reaction tube.

The measured thicknesses and specific resistivities of epitaxially grown silicon films on silicon wafers 24 resulting from the above operation are as shown in FIG. 3. FIG. 3 shows a uniformity of thickness of the epitaxial silicon films. This was due to the above-described temperature control. FIG. 3 also clearly shows a leveling effect on the specific resistivity attained by feeding an auxiliary PH$_3$ gas. If the auxiliary PH$_3$ gas were not fed, the specific, resistivity of the epitaxial silicon film would progressively increase from the lower number susceptors to the higher number susceptors. A very weak peak in the specific resistivity curve can be seen in FIG. 3. This peak, however, can be lowered by increasing the evacuating rate out of the reaction tube.

Assuming the tolerances for thickness and specific resistivity of epitaxial silicon films in most applications are +5% and ±7%, respectively, the above operation can produce 14 wafers or films having a 150 mm diameter satisfying the above requirements. In contract, vertical, horizontal, or barrel type vapor phase deposition systems in the prior art would produce only a maximum of about 10, 10, or 12 such wafers, respectively.

Figure 4:
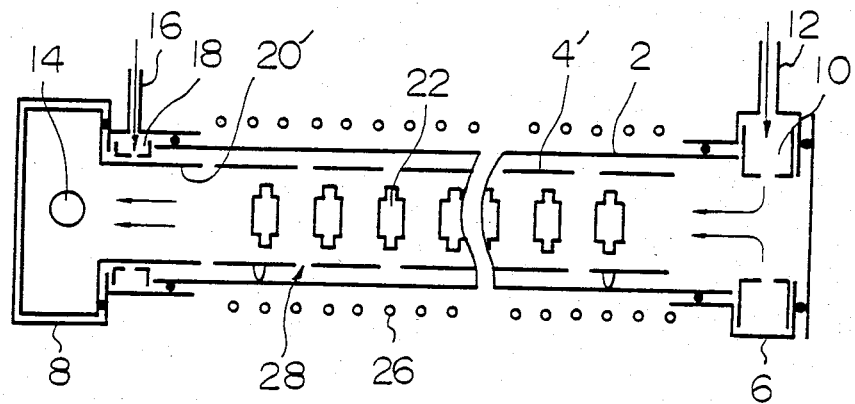
FIG. 4 is schematic representation of a second preferred embodiment of an apparatus for the present invention.

Next, the method according to the present invention was carried out by using a vapor phase deposition apparatus as shown in FIG. 4. This apparatus was similar to the apparatus used in the above-described test, except for the following:

(1) inner tube 4' has openings 28 distributed along the axis of the inner tube 3';

(2) annular guide member 20' has the same diameter as inner tube 4' to guide auxiliary gas into the space formed between tube 2 and inner tube 4'; and (3) the end of the above space between tubes 2 and 4' near inlet member 6 is open, no closed completely.

Figure 5:
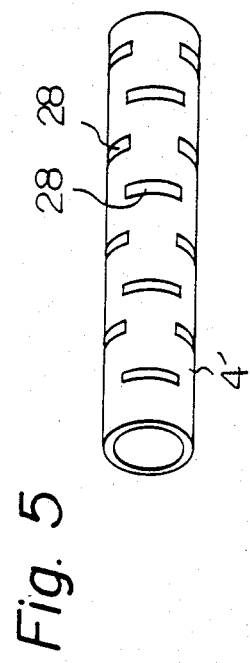
FIG. 5 is a perspective view of an inner tube of a reaction tube.

The shape and arrangement of openings 28 in inner tube 4 in this work are illustrated in FIG. 5. The openings are 2 mm wide and extend 100 mm around the wall of inner tube 4'. A plurality of pairs of openings are distributed at 100 mm intervals and staggered along the axis of inner tube 4',each pair's openings are directly opposite each other.

In the operation, SiH$_2$Cl$_2$, H$_2$, and H$_2$ containing 1 ppm-PH$_3$ were fed at rates of 500 cm$^3$/min, 5 l/min, and 18 cm$^3$/min as the main gas and H$_2$ containing 10 ppm-PH$_3$ was fed at a rate of 16 cm$^3$/min as the auxiliary gas. The pressure inside inner tube 4' was 1.0 Torr. The other conditions were the same as in the above-described operation.

Figure 6:
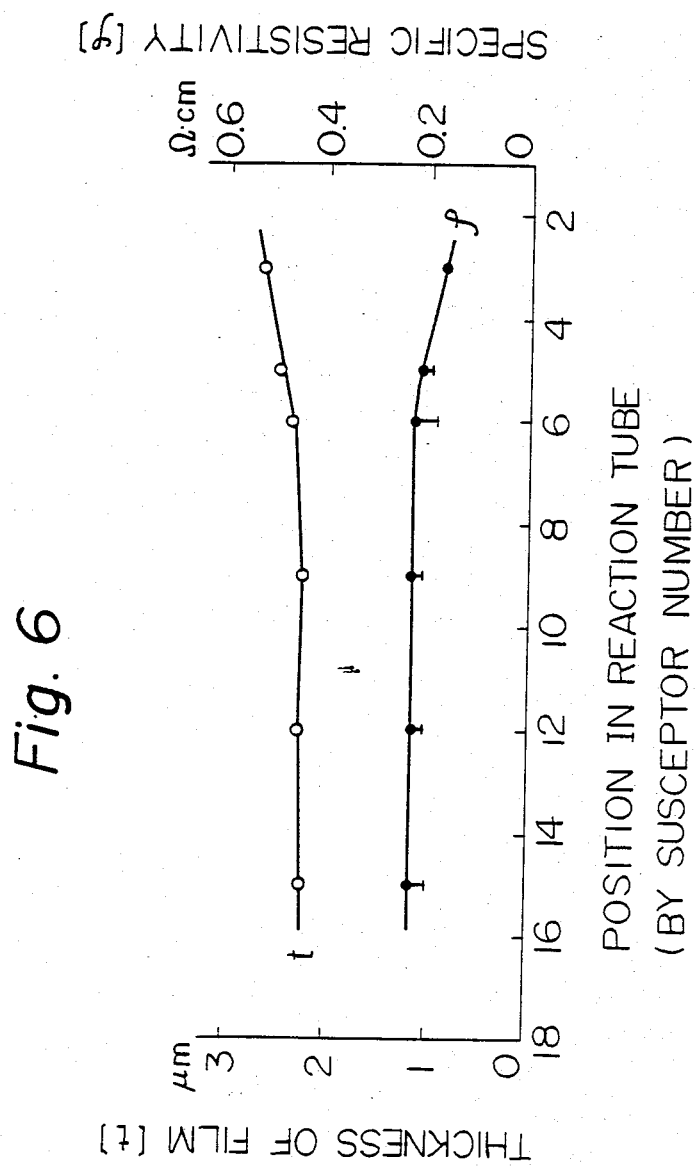
FIG. 6 is a graph of the thickness and specific resistivity of deposited films obtained by the apparatus in FIG. 4 vs the position in the reaction tube.

The results are shown in FIG. 6. Both the specific resistivities and thicknesses of epitaxial silicon films were quite uniform. About 18 to 20 150-mm-diameter films have passed the above-mentioned criteria in this operation. An experiment was carried out as below to prove the diffusion action in this invention. The apparatus as shown in FIG. 4 was used. SiH$_2$Cl$_2$ and H$_2$ were fed at rates of 450 cm$^3$/min and 5 l/min respectively through the auxiliary inlet pipe 16 into the reaction tube and evacuated out of discharge port 14. Inlet pipe 12 was closed. The pressure inside the reaction tube was 1.0 Torr. The susceptor arrangement and temperature profile in the reaction tube were similar to those in the above described operations.

Figure 7:
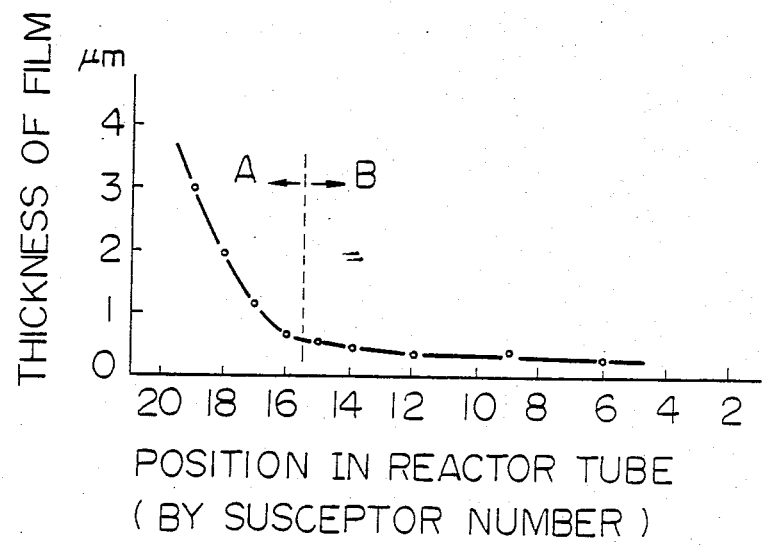
FIG. 7 is a graph of film thickness vs the position in the reaction tube in an experiment proving the diffusion action in the present invention.

The resultant thicknesses of the silicon films are shown in FIG. 7. If the thickness of a deposited film can be taken to be proportional to the amount of a gas flowing there, FIG. 7 shows that viscous flow gas A flows toward discharge port 16 without spreading beyond a rear part or a part near discharge port 16 of the reaction tube and that diffusion flow gas B reaches a front part or a part near inlet member 6 of the reaction tube with a monotonic decrease in the amount of the gas. It may be understood that an auxiliary impurity gas, such as PH$_3$ in the operation described above, flows with a concentration profile similar or related to the curve in FIG. 7 and contributes to deposition or doping. It is therefore understood that epitaxial films are doped desirably even at the rear part of the reaction tube by the presence of the auxiliary gas.

It should be noted that the auxiliary gas should be fed through relatively large bores or openings into the reaction tube so that the gas entering into the reaction tube can diffuse along the inner wall of the tube toward a main gas inlet. The gas should not be injected through a nozzle or nozzles to flow as a viscous flow. Clearly, the impurity concentration in a deposited film can be controlled by changing the concentration of the main and auxiliary impurity gases.

We claim:

1. A method of vapor phase deposition for growing a semiconductor layer on a plurality of wafers having major surfaces and arranged in a reaction tube having a longitudinal axis, comprising the steps of:

(a) arranging the plurality of wafers in a deposition region in the reaction tube such that each of the major surfaces of the plurality of wafers is parallel to the others and is transverse to the longitudinal axis of the reaction tube;

(b) feeding a main gas flow containing a reaction gas and an impurity gas into a first end of the reaction tube;

(c) passing the main gas flow through the deposition region in a first direction along the longitudinal axis of the reaction tube from the first end to a second end of the reaction tube;

(d) reducing the pressure inside the reaction tube;

(e) heating the plurality of wafers at a temperature at which the impurity doped semiconductor layer is grown, the temperature in the reaction tube being maintained between two values, such that a first temperature exists at the first end of the reaction tube and a second temperature, greater than that of the first temperature, exists at the second end of the reaction tube, the temperature in the reaction tube gradually increasing in a direction from the first end to the second end; and (f) introducing an auxiliary gas, containing an impurity gas, into the reaction tube at a position downstream of the deposition region at an introduction rate substantially lower than the feeding rate of the main gas flow, there by diffusing the impurity gas of the auxiliary gas in a second direction opposite that of the first direction.

2. A method of vapor phase deposition according to claim 1, wherein the reaction tube further comprises an inner tube inside the reaction tube and wherein said diffusing step c comprises the step of supplying the impurity gas to the plurality of wafers through openings in the inner tube.

3. A method of vapor phase deposition according to claim 1 or 2, wherein said step b of introducing the auxiliary gas comprises introducing only an impurity gas.

4. A method according to claim 1, wherein said step (g) comprises introducing the auxiliary gas at a rate more than 100 times lower than the feeding rate of the main gas flow.

5. A method according to claim 1, wherein said step (e) comprises increasing the temperature along the plurality of wafers, in a direction from the first end to the second end of the reaction tube, from 1,025° C. to 1,050° C.

6. A method according to claim 1, wherin said step (d) comprises reducing the pressure in the reaction tube to 1.0 Torr.

7. A method according to claim 1, wherein said step (c) comprises passing the main gas flow containing $SiH_2Cl_2$ at a feeding rate of 500 cm$^3$/min., $H_2$ at a feeding rate f 5l/min., and $H_2$ containing 1 ppm-$PH_3$ at a feeding rate of 20 cm$^3$/min., and wherein said step (g) comprises introducing the auxiliary gas containing $H_2$ containing 100 ppm-$PH_3$ at an introduction rate of 12 cm$^3$/min., the pressure inside the reaction tube being 1.0 Torr, and the temperature increasing along the plurality of wafers, in a direction from the first end to the second end of the reaction tube, from 1,025° C. to 1,050° C.

8. A method according to claim 2, wherein said step (c) comprises passing the main gas flow containing $SiH_2Cl_2$ at a feeding rate of 500 cm$^3$/min., $H_2$ at a feeding rate of 5l/min., and $H_2$ containing 10 ppm-$PH_3$ at a feeding rate of 18 cm$^3$/min., and wherein said step (g) comprises introducing the auxiliary gas comprising $H_2$ containing 10 ppm-$PH_3$ at an introduction rate of 16 cm$^3$/min., the pressure inside the reaction tube being 1.0 Torr, and the temperature increasing along the plurality of wafers, in a direction from the first end to the second end of the reaction tue, from 1,025° C. to 1,050° C.

9. A method according to claim 1, wherein said step (g) comprises the substep of guiding the auxiliary gas along an inner wall of the reaction tube.

10. A method according to claim 1, wherein said step (g) comprises the substep of guiding the auxiliary gas along a tubular member extending inside the reaction tube in the second direction.

11. A method according to claim 1, wherein the reaction tube comprises an inner tube and an outer tube and wherein said step (g) comprises the substep of introducing the auxiliary gas into an annular space provided between the inner tube and the outer tube, the inner tube having a plurality of openings distributed along the longitudinal axis.

* * * * *

UNITED STATES PATENT AND TRADEMARK OFFICE
CERTIFICATE OF CORRECTION

PATENT NO. : 4,510,177
DATED : APRIL 9, 1985
INVENTOR(S) : YUJI FURUMURA ET AL.

It is certified that error appears in the above-identified patent and that said Letters Patent is hereby corrected as shown below:

Col. 1, line 28, "thickness" should be --thickness,--.

Col. 2, line 27, "said" should be --the--.

Col. 3, line 30, "as" should be --an--;
line 37, "where" should be --were--;
line 40, "left" should be --inlet--;
line 46, "($SiH_1Cl_2$)," should be --($SiH_2Cl_2$),--;
line 49, "5 1/min" should be --5 $\ell$/min--;
line 55, "ppm-$P_3$" should be --ppm-$PH_3$--.

Col. 4, line 10, "+5%" should be --±5%--;
line 22, "3';" should be --$\overline{4}$';--;
line 36, "5 1/min," should be --5 $\ell$/min,--;
line 49, "5 1/min" should be --5 $\ell$/min--.

Col. 6, line 20, "f 51/min.," should be --of 5 $\ell$/min.,--;
line 31, "51/min.," should be --5 $\ell$/min.,--.

Signed and Sealed this

Thirteenth Day of August 1985

[SEAL]

Attest:

DONALD J. QUIGG

Attesting Officer     Acting Commissioner of Patents and Trademarks